Figure 1:
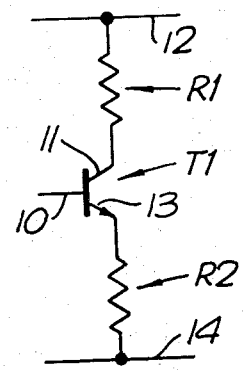

United States Patent [19]

Kane

[11] 4,161,742

[45] Jul. 17, 1979

[54] SEMICONDUCTOR DEVICES WITH MATCHED RESISTOR PORTIONS

[75] Inventor: Jeffrey Kane, Cheadle Hulme, England

[73] Assignee: Ferranti Limited, Hollinwood, England

[21] Appl. No.: 876,137

[22] Filed: Feb. 8, 1978

Related U.S. Application Data

[63] Continuation of Ser. No. 710,746, Aug. 2, 1976, abandoned.

[30] Foreign Application Priority Data

Aug. 2, 1975 [GB] United Kingdom ............... 32401/75

[51] Int. Cl.² ...................... H01L 27/04; H01L 27/02; H01L 29/72
[52] U.S. Cl. ........................................ 357/48; 357/36; 357/35; 357/47; 357/51
[58] Field of Search ....................... 357/36, 48, 71, 34, 357/51, 35, 47

[56] References Cited

U.S. PATENT DOCUMENTS

| | | | |
|---|---|---|---|
| 3,766,449 | 10/1973 | Bruchez | 357/36 |
| 3,818,463 | 6/1974 | Grundy | 357/48 |
| 3,827,034 | 7/1974 | Colaco | 357/48 |
| 3,922,707 | 11/1975 | Freed et al. | 357/48 |
| 3,946,425 | 3/1976 | Shoji et al. | 357/48 |
| 4,049,975 | 9/1977 | Colaco | 357/36 |
| 4,053,336 | 10/1977 | Grundy et al. | 357/48 |

Primary Examiner—Andrew J. James
Attorney, Agent, or Firm—Cameron, Kerkam, Sutton, Stowell & Stowell

[57] ABSTRACT

In an integrated circuit semiconductor device different matched resistors are provided by at least one resistor comprising at least two matched resistor parts connected together, these resistor parts also being matched to each constituent resistor part of at least one different matched resistor of the device.

12 Claims, 6 Drawing Figures

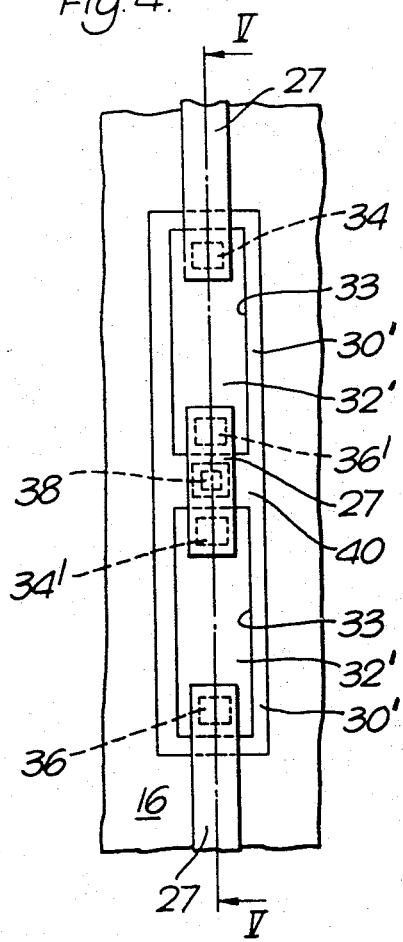

SEMICONDUCTOR DEVICES WITH MATCHED RESISTOR PORTIONS

This is a continuation of application Ser. No. 710,746, filed Aug. 2, 1976, now abandoned.

This invention relates to semiconductor devices and has particular relevance to the formation of P-N junction isolated resistors in integrated circuit devices.

P-N junction isolated resistors usually are at least partially formed in an integrated circuit device by at least one diffusion process step, and so that each P-N junction isolated resistor region is of one conductivity type and of high resistivity material, and is surrounded within the semiconductor body by an associated region of the opposite conductivity type and of low resistivity material. Usually also each resistor region of an integrated circuit device is of the same conductivity type. The associated surrounding region, usually, is isolated within the semiconductor body from the remainder of the device. Each resistor region may be a diffused region formed in said one diffusion process step; or each surrounding region may be at least completed in said one diffusion process step, possibly another portion of each surrounding region being provided in any convenient manner, for example, beneath the resistor region. In the latter cases each resistor region may be either a substantially unmodified region of the semiconductor body, for example, comprising an unmodified region of an epitaxial layer; or another diffused region. In the former case the surrounding region may be either wholly a substantially unmodified region of the semiconductor body, or may be formed at least partially in another diffusion process step. In any event the resistor region may have at least a portion formed in a diffusion process step.

Said one diffusion process step may comprise any process step in which impurity atoms are caused to be diffused through, or otherwise to be implanted in, the semiconductor body of the integrated circuit device.

For convenience in this specification and the accompanying claims each resistor will be considered as including at least a portion of one constituent region formed in said one diffusion process step, said one constituent region comprising either a resistor region or an associated surrounding region.

When a plurality of different resistors are required to be embodied within an integrated circuit device, with the different resistors having different predetermined resistance values, but each resistor being provided by a single resistor region and an associated surrounding region, having at least a portion of one constituent region formed in a diffusion process step, it is inevitable that the provision of the diffused regions or portions of regions effect the depletion layers associated with the different resistor region isolating P-N junctions by different amounts. Hence, it is difficult to provide within the integrated circuit device the desired different resistors with the different predetermined resistance values. Further, it is required that each resistor should have the same or closely similar voltage coefficients, which is not possible with the arrangement referred to above.

It is required that the desired different resistors are substantially matched, by having electrical characteristics as identical as possible. With matched resistors the provision of the required different resistors with the different predetermined resistance values is facilitated.

It is an object of the present invention to provide an integrated circuit device having a plurality of different, substantially matched resistors.

It is particularly important that different, substantially matched resistors are provided in different parts of an integrated circuit device having both digital and analogue operations, for example, in a digital-to-analogue converter integrated circuit device.

According to the present invention a semiconductor device in a semiconductor body including a plurality of different substantially matched resistors with at least a portion of one constituent region of each resistor formed in one diffusion process step, has at least one resistor comprising at least two substantially matched resistor parts, each matched resistor part comprising at least one resistor region individually isolated within the semiconductor body by a P-N junction, and an associated surrounding region, the isolating P-N junction being between the resistor region and the surrounding region, the resistor being completed by the constituent resistor regions being connected together, the constituent matched resistor parts of said one resistor also being substantially matched to each constituent resistor part of at least one different matched resistor of the device.

Thus, there is provided the required plurality of different, substantially matched resistors, and the provision of such substantially matched resistor parts in the integrated circuit device facilitating the provision of the required plurality of different, substantially matched resistor of the device.

At least two of the constituent substantially matched resistor parts of the device may have a common associated surrounding region.

The constituent substantially matched resistor parts of the device may be as identical in construction with each other, including their shape, as conveniently can be provided with conventional process steps, and in particular the constituent diffused region or regions, or each diffusion portion of a region or regions, provided in said one diffusion process step, are formed such that this criterion is obtained.

Alternatively, at least two of the constituent substantially matched resistor parts of the device may have different, but related, constructions, and have predetermined different resistance values. When different matched resistor parts are provided, at least one functional component of the integrated circuit device may have only identical constituent matched resistor parts, the different matched resistor parts being provided for the different functional components.

It may be necessary to provide the best compromise between the required extent of matching for the resistor parts and, for example, the area of the surface of the semiconductor body occupied by each substantially matched resistor part.

When the integrated circuit device is connected to a source of electrical energy, and desired operating potential levels are applied to the constituent regions of the device, inevitably for the two spaced electrode-bearing ends of each constituent resistor region, under normal operating conditions for the device, one of said two spaced electrode-bearing ends is at a more positive potential level than the other end, said other end being at a more negative potential level than said one end. It is convenient that all the electrode-bearing ends of the constituent resistor regions to be of the same relative potential level polarity, compared with the relative potential level polarity of the other ends, are connected to the associated surrounding regions, the surrounding regions being isolated within the semiconductor body from the remainder of the device. In such an arrangement it is essential that the isolating P-N junctions between the resistor regions and the associated surrounding regions do not become forward biased under normal operating conditions for the integrated circuit device.

A matched resistor part may have the construction described and claimed in copending patent application Ser. No. 748,464, entitled "Semiconductor Devices", and comprising a centre tapped resistor part having two identical constituent resistor regions, with the centre tap therebetween connected to a common associated surrounding region isolated within the semiconductor body from the remainder of the device.

Figure 2:
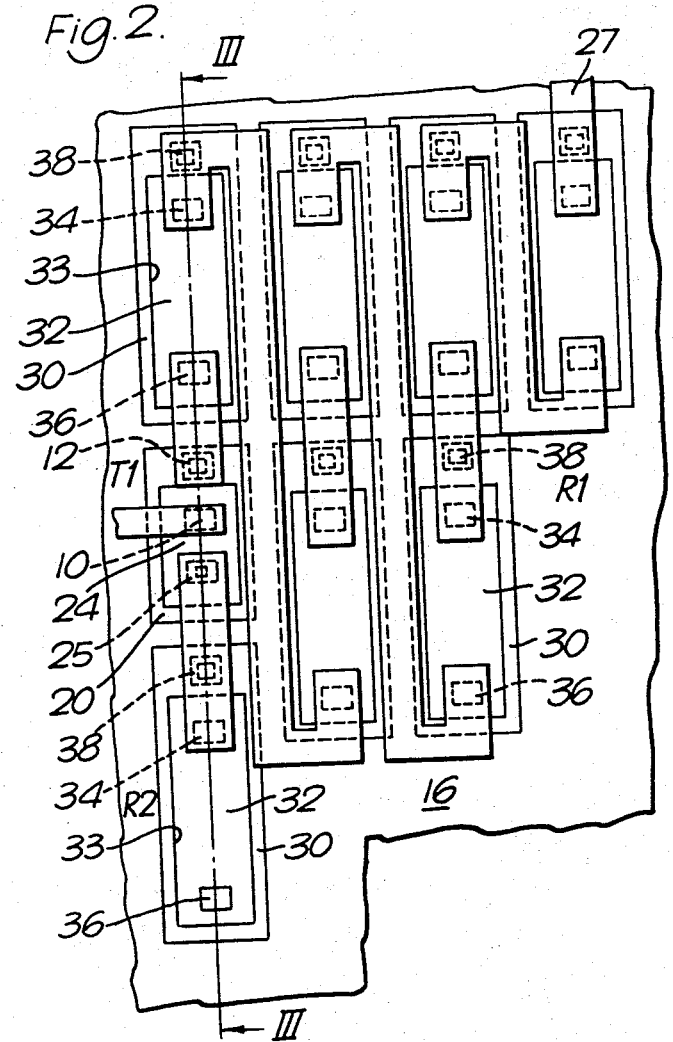
Figure 3:
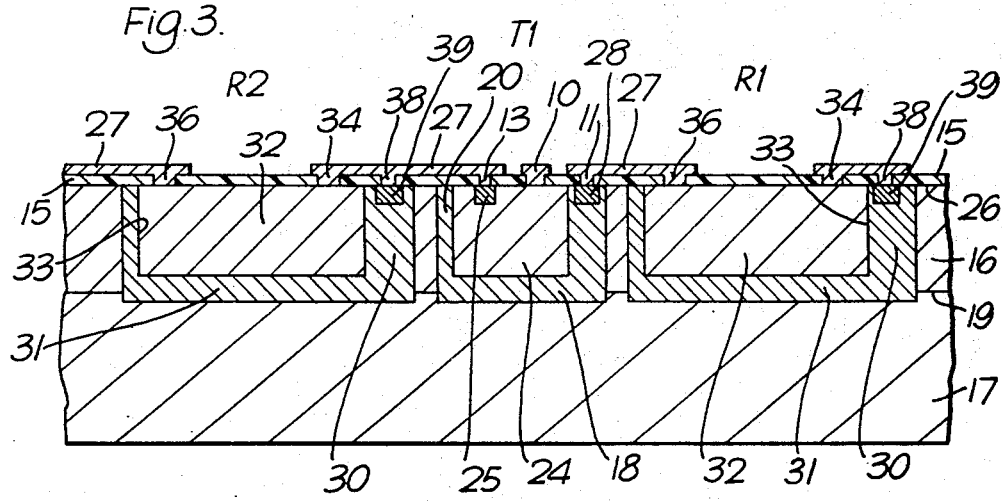
Figure 5:
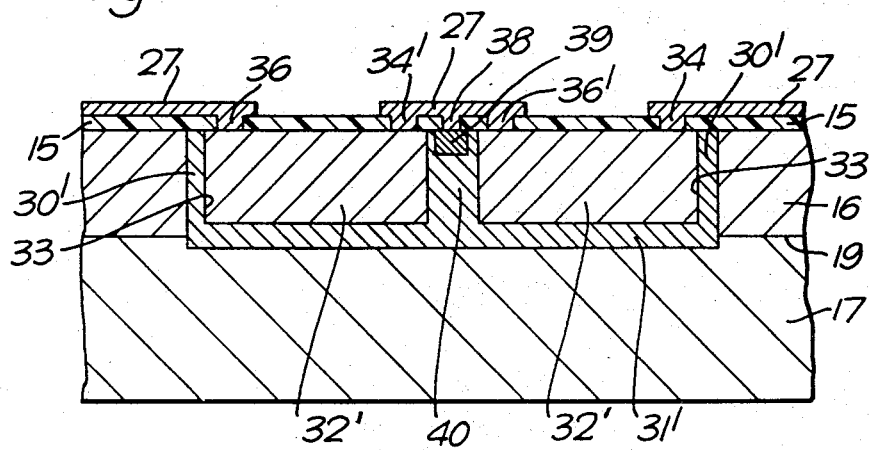

One embodiment of the present invention will now be described by way of example with reference to the accompanying drawings, in which;

FIG. 1 is a circuit diagram of a transistor amplifier having two different resistance values, FIG. 2 is a plan view of part of an integrated circuit device embodying the amplifier of FIG. 1, and having different matched resistors with constituent identical matched resistor parts, FIG. 3 is a section on the line III—III of FIG. 2, FIG. 4 is a plan view of part of another integrated circuit device, the illustrated part showing an alternative form of resistor part construction to that shown in FIGS. 2 and 3, FIG. 5 is a section on the line V—V of FIG. 4, and FIG. 6 is a plan view of two different, substantially matched resistor parts to provide different, substantially matched resistors in an integrated circuit device.

In FIG. 1 an amplifier circuit is shown which comprises an NPN transistor T1, having a base electrode 10, a collector electrode 11 connected via a resistor R1 to a first voltage rail 12, and an emitter electrode 13 connected via a resistor R2 to a second voltage rail 14. The resistance value of the resistor R1 is required to be six times greater than that of the resistor R2.

The amplifier of FIG. 1 is embodied within part of an integrated circuit semiconductor device as shown in FIGS. 2 and 3. In FIG. 2 a passivating layer 15 of silicon oxide is omitted for the sake of clarity, but apertures through the passivating layer for electrodes on the passivating layer to contact the silicon semiconductor body therebeneath are indicated by dotted lines. Further, the electrical connections are indicated by continuous lines, as also are the surface portions of P-N junctions, except where they extend beneath the electrodes, and electrical connections for the electrodes, where they are indicated by dotted lines. Buried layers within the semiconductor body also are not indicated in FIG. 2.

The transistor T1 has the known, so-called collector-diffusion-isolation (CDI) construction, the semiconductor body of the integrated circuit device comprising a P type epitaxial layer 16 on a P type substrate 17. A buried N type layer 18 is provided at a portion of the interface 19 between the epitaxial layer 16 and the substrate 17. The buried layer 18 comprises a portion of the collector of the transistor T1, the collector being completed by an N type diffused isolation barrier 20 for the transistor extending through the epitaxial layer 16 to contact the buried layer 18. The collector 18, 20 defines a base comprising an unmodified region 24 of the epitaxial layer, and an emitter 25 is formed by diffusion of a donor impurity into a part of the base 24 adjacent to the surface 26 of the epitaxial layer remote from the substrate. The passivating layer 15 is provided on the surface 26, and the collector, base and emitter electrodes, respectively, 11, 10 and 13, are provided through apertures in the passivating layer 15 from metal electrical connections 27 on the passivating layer A collector contact portion 28 is provided within the isolation barrier 20, which collector contact portion 28 is connected to the collector electrode 11. The collector contact portion 28 is provided in the same diffusion process step as the emitter 25, and has a lower resistivity value than contiguous other portions of the isolation barrier 20, and facilitates the connecting of the collector electrode 11 to the isolation barrier.

The resistors R1 and R2 have constituent resistor parts, each resistor part having a construction closely resembling that of the CDI transistor described above. In particular the resistor parts are provided by the same processing steps as those required to provide the transistor.

The resistor R2 comprises only one resistor part, comprising an N type diffusion isolation barrier 30 for the resistor region, extending through the epitaxial layer to contact a buried N type layer 31 at a portion of the interface 19 between the epitaxial layer 16 and the substrate 17. There is thus defined a resistor region 32 comprising an unmodified region of the P type epitaxial layer. The resistivity value of the material of the resistor region 32 is higher than that of the N type material of the isolation barrier 30 and the buried layer 31. Between the resistor region 32 and the combination of the isolation barrier 30 and the buried layer 31, comprising a region surrounding the resistor region, is a P-N junction 33 isolating the resistor region. The surrounding region 30, 31 is isolated within the semiconductor body from the remainder of the device. Electrodes 34 and 36 are provided at opposite ends of the resistor region. The electrodes 34 and 36 extend through apertures in the passivating layer 15 from the electrical connections 27.

The resistor R1 of the amplifier comprises six resistor parts connected in series. Each portion of each constituent resistor part of the resistor R1 is given the same reference numeral as the corresponding portion of the sole resistor part of the resistor R2, and is identical thereto. The electrical connections 27 on the passivating layer provide the required series connections between the six resistor parts of the resistor R1. Separate surrounding regions 30, 31 are provided for the six identical resistor parts of the resistor R1.

Because the six constituent resistor parts of the resistor R1, and the sole constituent resistor part of the resistor R2, are identical in construction with each other they are matched i.e. have electrical characteristics as identical as possible. In particular the effects of the diffused portion 30 of the surrounding region 30, 31 on the depletion layer (not shown) associated with the isolating P-N junction 33 between the surrounding region 30, 31, and the resistor region 32 of each resistor part, are identical; and each resistor part has the same voltage coefficient. By the term, voltage coefficient it is meant the voltage operating characteristic of a resistor or resistor region. Because the resistor parts are so matched the provision within the integrated circuit semiconductor device of the desired different, matched resistors R1 and R2, with the resistor R1 being required to have a resistance value six times that of the resistor R2, is facilitated.

The bias potential required to prevent the resistor region isolating P-N junctions from becoming forward biased is advantageously low.

It is convenient, as shown, but not essential, to provide electrodes 38 connected to each isolation barrier 30 of the matched resistor parts. Each electrode 38 extends through an aperture in the passivating layer 15, from an electrical connection 27 to the electrode 34 of each resistor region. Under normal operating conditions for the integrated circuit device the electrode-bearing end of each resistor region having the electrode 34 is more positive than the other electrode bearing end having the electrode 36. An electrode contact portion 39 is provided within each isolation barrier 30, the electrodes 38 being connected to the portions 39. The electrode contact portions 39 are provided in the same diffusion process step as the collector electrode contact portion 28, and facilitate the connecting of the electrodes 38 to the isolation barriers 30. This arrangement facilitates the provision of the matched resistor parts.

It is possible that the electrode 38 to the surrounding regions is connected to the electrodes 36 at the more negative electrode-bearing end of each resistor region.

An alternative construction for a constituent resistor part of an integrated circuit device according to the present invention is shown in FIGS. 4 and 5. The alternative construction is described and claimed in copending patent application Ser. No. 784,464. In FIGS. 4 and 5 portions of the resistor part or portion identical with or closely resembling corresponding portions of each resistor part of FIGS. 2 and 3 are given the same reference numerals as in FIGS. 2 and 3. The alternative construction for a resistor part differs from that of FIGS. 2 and 3 in that two identical constituent resistor regions 32' are provided, each such resistor region being individually isolated by a P-N junction 33 between the resistor region and a common associated surrounding region. The common associated surrounding region comprises the combination of a buried layer 32' at a portion of the interface 19 between the epitaxial layer 16 and the substrate 17 and an isolation barrier 30' for each resistor region 32', the isolation barrier 30' extending through the epitaxial layer to contact the buried layer. The isolation barrier 30', in encircling both resistor regions 32', has a portion 40 extending between the two resistor regions. An electrode 38 contacts an electrode contact portion 39 provided within the isolation barrier portion 40.

Under normal operating conditions for the integrated circuit device either electrode-bearing end of the resistor part becomes more positive than the other electrode-bearing end of the resistor part. If the electrodes 34' and 36' at the opposing ends of the resistor regions 32' are connected together, the resistor part end electrodes 34 and 36 are spaced from these electrodes 34' and 36', and the electrodes 34' and 36' are at a potential level midway between those of the electrodes 34 and 36. Further, if, as illustrated, the electrodes 34' and 36' are connected to the electrode 38 to the surrounding region, the whole of the surrounding region is at this intermediate potential level. Thus, the bias potential across different parts of each P-N junction isolating the constituent resistor regions is lower than would otherwise be the case. Further, either resistor part end electrode 34 or 36 may be the more positive, and it is equally unlikely that the P-N junctions isolating the resistor regions will become forward biased.

There is a tendency for the voltage coefficients of the two resistor regions to cancel each other, being of opposite sense, so that the resistor part has a much lower voltage coefficient than would otherwise be the case.

In a typical CDI-type structure a maximum forward bias for the isolating P-N junctions of the order of 400 mV is imposed.

With the arrangements of FIGS. 2 and 3, and 4 and 5 the surrounding regions are required to be isolated within the semiconductor body from the remainder of the device. They may be isolated by P-N junctions or dielectric layers.

It is not essential that identical matched resistor parts are provided. In FIG. 6, which corresponds to part of FIG. 2, there is shown two different, substantially matched resistor parts having predetermined different resistance values. Each such resistor part is identical to or closely resembles the resistor parts of FIGS. 2 and 3, and the same reference numerals are used in FIG. 6, as are used in FIGS. 2 and 3, to identify identical or closely resembling portions of the resistor parts.

In FIG. 6 the two resistor regions 32 of the resistor parts differ from each other in that they occupy different areas of the surface 26 of the epitaxial layer 16 of the semiconductor body.

Substantially matched, but different resistor parts may differ from each other in other constructional details, whilst having related constructions, for example, only one such resistor part may have the centre tapped construction shown in FIGS. 4 and 5.

The resistance of each matched resistor part is selected so that the different resistors required within the integrated circuit device may be provided by series and/or parallel combinations of the matched resistor parts.

It is particularly advantageous that a semiconductor device according to the present invention has a CDI type construction, but the device may have any convenient construction. In particular the constituent resistor parts may have any convenient construction and, for example, may comprise pinch resistors.

What I claim is:

1. A semiconductor device in a semiconductor body comprising:
    (a) first and second resistors, said first resistor having a greater impedance than said second resistor;
    (b) said first resistor including at least first and second substantially-matched resistor portions, and means for electrically connecting said first and second resistor portions to form said first resistor;
    (c) said second resistor including at least a third resistor portion, each of said first, second and third resistor regions being matched to each other to have substantially similar electrical characteristics and to provide said first and second resistors of accurately determinable impedances; and
    (d) each of said first, second and third resistor portions isolated individually within said semiconductor body by an isolating P-N junction and an associated surrounding diffused region, said associated surrounding regions being isolated from each other within said semiconductor body, each of said isolating P-N junctions being disposed between a resistor region and its surrounding region, said associated surrounding regions being made substantially wholly of a material having a lower resistivity than that of each of said first, second and third resistor portions.

2. The semiconductor device as claimed in claim 1, in which said first, second and third resistor portions of said semiconductor device are identical in construction.

3. The semiconductor device as claimed in claim 1, having for each of said first and second resistor portions two spaced electrode-bearing ends, under normal operating conditions for said semiconductor device one of said two spaced electrode-bearing ends being at a more positive potential level than the other end, said other end being at a more negative potential level than said one end, and in said semiconductor device all the electrode-bearing ends of said first and second resistor portions to be of the same relative potential level polarity, compared with the relative potential level polarity of the other ends, are connected to said associated surrounding regions, said surrounding regions being isolated within the semiconductor body from the remainder of said semiconductor device.

4. The semiconductor device as claimed in claim 1, in which at least one of said first, second and third resistor portions comprises a center-tapped resistor portion, having first and second identical constituent resistor parts with the center-tap therebetween connected to a common associated surrounding region isolated within said semiconductor body from the remainder of said semiconductor device.

5. A semiconductor device in a semiconductor body comprising:
 (a) first and second resistors, said first resistor having a greater impedance than said second resistor;
 (b) said first resistor including at least first and second substantially matched resistor portions, and means for electrically connecting said first and second resistor portions to form said first resistor;
 (c) said second resistor including at least a third resistor portion; and
 (d) each of said first, second and third resistor portions isolated individually within said semiconductor body by an isolating P-N junction having an associated depletion layer and an associated surrounding diffused region, said associated surrounding regions being isolated from each other within said semiconductor body, each of said isolating P-N junctions being disposed between a resistor and its surrounding region, each of said first, second and third resistor regions being matched to each other and each of said surrounding regions being made substantially wholly of a material having a lower resistivity than that of said first, second and third resistor regions so that the effect of a surrounding region upon the depletion layer associated with each of said first, second and third resistor regions is substantially the same.

6. The semiconductor device as claimed in claim 5, wherein each of said first, second and third resistor portions has substantially similar voltage coefficients.

7. The semiconductor device as claimed in claim 5, wherein each of said first, second and third resistor portions provides substantially equal impedances.

8. A semiconductor device in a semiconductor body comprising:
 (a) a composite resistor including at least first and second substantially matched resistor portions;
 (b) means for electrically connecting said first and second resistor portions to form said composite resistor;
 (c) each of said first and second resistor portions being matched to each other to have substantially similar electrical characteristics and being isolated individually within said semiconductor body by an isolating P-N junction and an associated surrounding diffused region, said surrounding associated regions being isolated from each other within said semiconductor body, each of said associated surrounding regions being made substantially wholly of a material having a lower resistivity than that of each of said first and second resistor portions; and
 (d) said electrode means connecting said first and second resistor portions in series with each other.

9. The semiconductor device as claimed in claim 8, wherein each of said first and second resistor portions includes first and second electrodes disposed at each end thereof, means for maintaining said first electrodes of said first and second resistor portions at a more positive potential level than said second electrodes of each of said first and second resistor portions, and means for connecting one of said first and second electrodes of both of said first and second resistor portions to its associated surrounding region, each of said associated surrounding regions being isolated within said semiconductor body from the remainder of said semiconductor device.

10. A semiconductor device in a semiconductor body comprising:
 (a) a composite resistor including at least first and second substantially matched resistor portions;
 (b) means for electrically connecting said first and second resistor portions to form said composite resistor;
 (c) each of said first and second resistor portions being matched to each other to have substantially similar electrical characteristics and being isolated individually within said semiconductor body by an isolating P-N junction and an associated surrounding diffused region, said surrounding associated regions being isolated from each other within said semiconductor body, each of said associated surrounding regions being made substantially wholly of a material having a lower resistivity than that of each of said first and second resistor portions; and
 (d) said electrode means connecting said first and second resistor portions in parallel with each other.

11. The semiconductor device as claimed in claim 10, wherein each of said first and second resistor portions includes first and second electrodes disposed at each end thereof, means for maintaining said first electrodes of said first and second resistor portions at a more positive potential level than said second electrodes of each of said first and second resistor portions, and means for connecting one of said first and second electrodes of both of said first and second resistor portions to its associated surrounding region, each of said associated surrounding regions being isolated within said semiconductor body from the remainder of said semiconductor device.

12. A semiconductor device in a semiconductor body comprising:
 (a) a composite resistor comprising a plurality of substantially matched resistor portions;
 (b) each of said plurality of resistor portions being isolated individually within said semiconductor body by an isolating P-N junction and an associated surrounding diffused region, said associated surrounding regions being isolated from each other within said semiconductor body, each of said isolating P-N junctions being disposed between its resistor portion and its surrounding region, said associated surrounding regions being made substantially wholly of a material having a lower resistivity than that of each of said plurality of resistor portions;
(c) each of said plurality of resistor portions having first and second electrodes disposed at each end thereof; and
(d) means for interconnecting each of said plurality of resistor portions in series with each other by connecting said second electrode of one resistor portion to said first electrode of another resistor portion, and for connecting one of said first and second electrodes of each of said plurality of resistor portions to its associated surrounding region.

* * * * *